(12) United States Patent
Kimmlingen et al.

(10) Patent No.: US 9,182,466 B2
(45) Date of Patent: Nov. 10, 2015

(54) GRADIENT COIL ARRANGEMENT AND PRODUCTION METHOD

(75) Inventors: Ralph Kimmlingen, Zirndorf (DE); Johann Schuster, Oberasbach (DE)

(73) Assignee: Siemens Aktiengesellschaft, München (DE)

( * ) Notice: Subject to any disclaimer, the term of this patent is extended or adjusted under 35 U.S.C. 154(b) by 1224 days.

(21) Appl. No.: 13/090,070

(22) Filed: Apr. 19, 2011

(65) Prior Publication Data
US 2012/0119741 A1   May 17, 2012

(30) Foreign Application Priority Data

Apr. 20, 2010   (DE) .......................... 10 2010 015 631

(51) Int. Cl.
*G01R 33/385* (2006.01)
*H01F 7/06* (2006.01)

(52) U.S. Cl.
CPC ........ *G01R 33/3858* (2013.01); *G01R 33/3856* (2013.01); *Y10T 29/4902* (2015.01)

(58) Field of Classification Search
CPC .................. G01R 33/3856; G01R 33/3858
USPC .................. 324/300–322; 29/602.1; 336/199
See application file for complete search history.

(56) References Cited

U.S. PATENT DOCUMENTS

| | | | | |
|---|---|---|---|---|
| 6,011,394 A | * | 1/2000 | Petropoulos et al. | 324/318 |
| 6,111,412 A | * | 8/2000 | Boemmel et al. | 324/318 |
| 6,943,551 B2 | * | 9/2005 | Eberler et al. | 324/318 |
| 7,154,270 B2 | * | 12/2006 | Arz et al. | 324/318 |
| 7,927,442 B2 | * | 4/2011 | Schuster et al. | 156/87 |
| 2005/0093543 A1 | * | 5/2005 | Arik et al. | 324/318 |
| 2006/0262826 A1 | * | 11/2006 | Dietz et al. | 372/96 |
| 2008/0024134 A1 | * | 1/2008 | Schuster et al. | 324/319 |
| 2011/0074421 A1 | * | 3/2011 | Sakakura | 324/318 |

FOREIGN PATENT DOCUMENTS

| | | |
|---|---|---|
| DE | 102 35 055 A1 | 3/2004 |
| DE | 103 14 215 A1 | 10/2004 |
| DE | 10 2006 029 959 A1 | 1/2008 |

OTHER PUBLICATIONS

German Office Action dated Jan. 14, 2011 for corresponding German Patent Application No. DE 10 2010 015 631.0-54 with English translation.

* cited by examiner

*Primary Examiner* — Melissa Koval
*Assistant Examiner* — Rishi Patel
(74) *Attorney, Agent, or Firm* — Lempia Summerfield Katz LLC

(57) ABSTRACT

The present embodiments optimize a gradient coil structure with a gradient coil arrangement for a magnetic resonance tomography device. The gradient coil arrangement includes a carrier plate with holes. Inserts are located in the holes. The inserts are made of an electrically isolating, thermally conductive material.

22 Claims, 6 Drawing Sheets

FIG 2
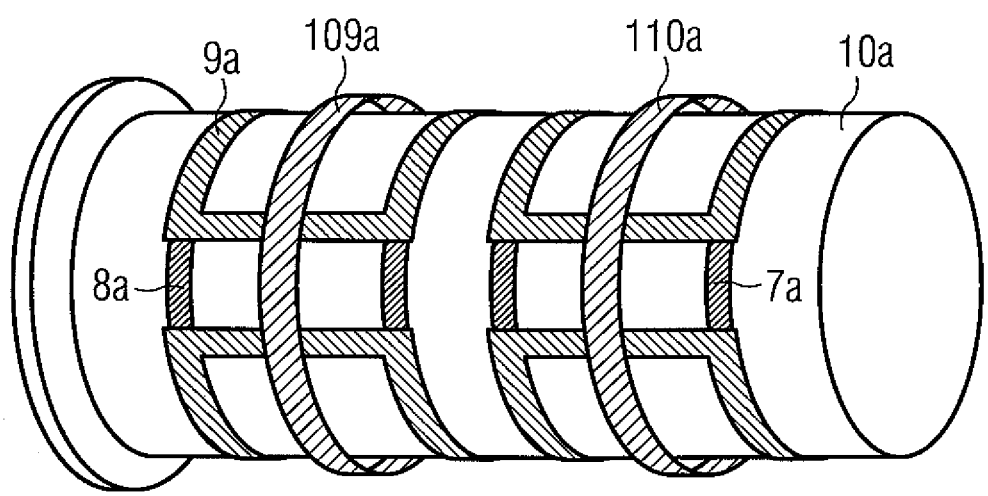

US 9,182,466 B2

GRADIENT COIL ARRANGEMENT AND PRODUCTION METHOD

This application claims the benefit of DE 10 2010 015 631.0, filed Apr. 20, 2010.

BACKGROUND

The present embodiments relate to a gradient coil arrangement for a magnetic resonance tomography device.

Magnetic resonance devices (e.g., an MR device) for examining patients using magnetic resonance tomography systems are, for example, known from DE10314215.

Modern magnetic resonance systems (MRT) work with coils for emitting high-frequency pulses for nuclear resonance excitation and/or for receiving induced magnetic resonance signals. A magnetic resonance system may include a permanent magnet or a superconducting coil for generating a basic magnetic field (HO) that is as homogeneous as possible in an examination area, and may include a large body coil that may be permanently incorporated into the MR device and multiple small local coils (e.g., surface coils or LC). To read out information, from which images of a patient may be generated, selected regions of the object or patient to be examined may be read out with gradient coils for three axes (e.g., X and Y axes approximately radial to the patient and a Z axis in a longitudinal direction of the patient). The spatial encoding in the magnetic resonance tomography system may be realized with the aid of a gradient coil arrangement with three independently controllable, magnetically orthogonal gradient field coil systems (e.g., three freely scalable fields). By overlaying the three freely scalable fields (in three directions X, Y, Z), the orientation of an encoding plane ("gradient field") may be freely selected.

Gradient field coils may be operated with high currents and large steady-state power dissipations and are therefore cooled. Because the field efficiency depends on the radius of the field-generating coils, the three conductor-bearing regions (X, Y, Z) provided are fitted on top of and close to one another. To dissipate large amounts of heat, at least one cooling plane directly adjacent to the gradient coils is fitted onto or between the regions.

In the case of thin-walled (e.g., approximately 70 mm thick) gradient coils, an approximately 4 mm thick cooling layer may be incorporated for each of the three primary and secondary gradient axes.

A coil body may be manufactured, for example, from an epoxy resin mass of high electric strength that, in a vacuum casting procedure, fills all hollow spaces of the concentric layer structure of the (gradient) coil sections. The casting compound fills radial gaps between the wire ranges that are advantageous for achieving the electric strength.

Wires for the structure of the transverse coils (X, Y) are fixed on level GRP carrier plates and rolled cylindrically. The GRP carrier plates have a high mechanical strength and support the isolation strength between two adjacent gradient axes even if no casting compound penetrates into the radial gap. The wires for gradient coils for the Z axis are cylindrically wound onto one of the GRP carrier plates. A cooling layer is either built up of metallic, electrically conductive structures or of non-metallic, electrically isolating structures.

SUMMARY AND DESCRIPTION

The present embodiments may obviate one or more of the drawbacks or limitations in the related art. For example, the structure of a gradient coil may be optimized.

The present embodiments include a gradient coil arrangement for a magnetic resonance tomography device, the gradient coil arrangement includes at least one carrier plate with holes, in which inserts are located. The inserts may be made of electrically isolating and, for example, thermally conductive material.

In the following, "holes" may refer to, for example, openings in the carrier plate penetrating through the carrier plate. The openings are, for example, drilled or molded when the plate is cast. According to one embodiment, the holes are punched perforations in the carrier plate.

An advantage of the present embodiments (e.g., a modification of the layer structure of a gradient coil) may be a simple optimization of heat transfer for cooling the gradient coil by a cooling layer. The structure compared with conventional structures may, however, be achieved here with acceptable effort and at reasonable cost.

The inserts may be inserts arranged in the holes. The thickness of the inserts may be greater than the thickness of the carrier plate in order, for example, to optimize the contact pressure on layers touched by the carrier plate and to optimize the thermal conduction.

Thermal conductors may be inserted into the holes with the aid of a carrier network that carries all requisite pads at designated points (e.g., in holes in the network), and may be impregnated by the casting compound.

BRIEF DESCRIPTION OF THE DRAWINGS

FIG. 2 shows a cross-section of one embodiment of gradient coils for the (horizontal) X axis and the (vertical) Y axis.

DETAILED DESCRIPTION OF THE DRAWINGS

Figure 1:
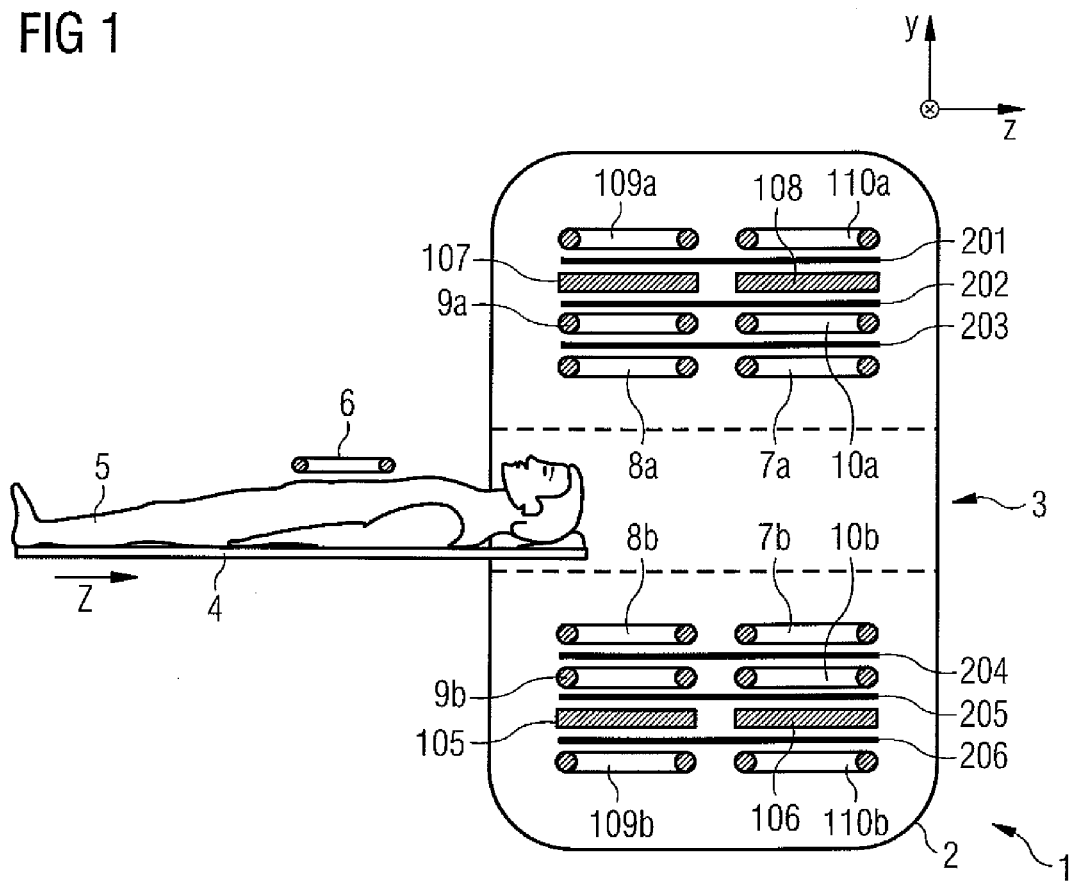
FIG. 1 shows an MRT with gradient coils.

FIG. 1 shows a magnetic resonance device MRT 1 with a body coil 2. The body coil 2 includes a tube-shaped space 3, into which a patient couch 4 (e.g., a patient bed) accommodating an examination object such as, for example, a patient 5 and a local coil 6 may be moved in order to generate recordings of the patient 5. The body coil 6, gradient coils arranged on the body coil 6 and cooling systems for the body coil 6 and the gradient coils are also designated as a gradient coil arrangement.

To read out information, from which images of the patient 5 may be generated, selected regions of the object or patient to be examined are read out with gradient coils for symbolically illustrated three axes X, Y, Z (e.g., the X and Y axes approximately radial to the patient and the Z axis in a longitudinal direction of the patient). Spatial encoding in the magnetic resonance tomography system may be realized with the aid of a gradient coil system with three independently controllable, magnetically orthogonal gradient field coil systems. Pairs of gradient coils for generating gradient fields in the X direction, the Y direction and the Z direction are diagrammatically illustrated in FIG. 1 for the three independently controllable, magnetically orthogonal gradient field coil systems by way of example.

Cooling layer systems are provided in the body coil 2. In the embodiment shown in FIG. 1, pairs of saddle-coil-shaped gradient coils 7a, 7b and 8a, 8b for generating a Y gradient field in the Y direction, pairs of saddle-coil-shaped gradient coils 9a, 9b and 10a, 10b for generating an X gradient field in the X direction, and pairs of gradient coils 109a, 109b and 110a, 110b for generating a Z gradient field in the Z direction are provided.

The pairs of gradient coils 7a, 7b, 8a, 8b, 9a, 9b, 10a, 10b, 109a, 109b, 110a, 110b (e.g., the saddle coils or the gradient coils) form a unit together with cooling layers 105, 106, 107, 108. One of the cooling layers 105, 106, 107, 108 (e.g., a layer with cooling elements) may be arranged between two layers of gradient coils (e.g., between a layer of the saddle coil gradient coils 9a, 9b and 10a, 10b for generating the X gradient field in the X direction and a layer of gradient coils 109a, 109b and 110a, 110b for generating the Z gradient field in the Z direction).

Alternatively or additionally a cooling layer may be disposed between the gradient coils 7a, 7b and 8a, 8b for generating the Y gradient field in the Y direction and the gradient coils 9a, 9b and 10a, 10b for generating the X gradient field in the X direction. In one embodiment, the cooling layer abuts only one layer of gradient coils FIG. 1, wholly internal or wholly external).

Carrier plates 201, 202, 203, 204, 205, 206 may be arranged between the gradient coil layers and/or between a gradient coil layer and a cooling layer. Alternatively, one carrier plate is provided.

FIG. 1 shows the gradient coils 7a, 7b, 8a, 8b, 9a, 9b, 10a, 10b, 109a, 109b, 110a and 110b, the carrier plates 201, 202, 203, 204, 205, 206 and the cooling layers 105, 106, 107, 108 spaced apart in order to improve clarity, but elements lying above one another may touch one another in order to save space, transfer heat or optimize the magnetic field (e.g., as FIGS. 5-8 show).

FIG. 2 shows, as a cross-section through one embodiment of the magnetic resonance device 1 (with cooling layers omitted for simplicity), the gradient coils 8a, 8b for generating the Y gradient field in the Y direction, the gradient coils 9a, 9b for generating the X gradient field in the X direction, and the gradient coils 109a, 109b and 110a, 110b for generating the Z gradient field in the Z direction. The field of the gradient coils 8a, 8b is aligned in the Y direction, and the field of the gradient coils 9a, 9b is aligned in the X direction.

Figure 3:
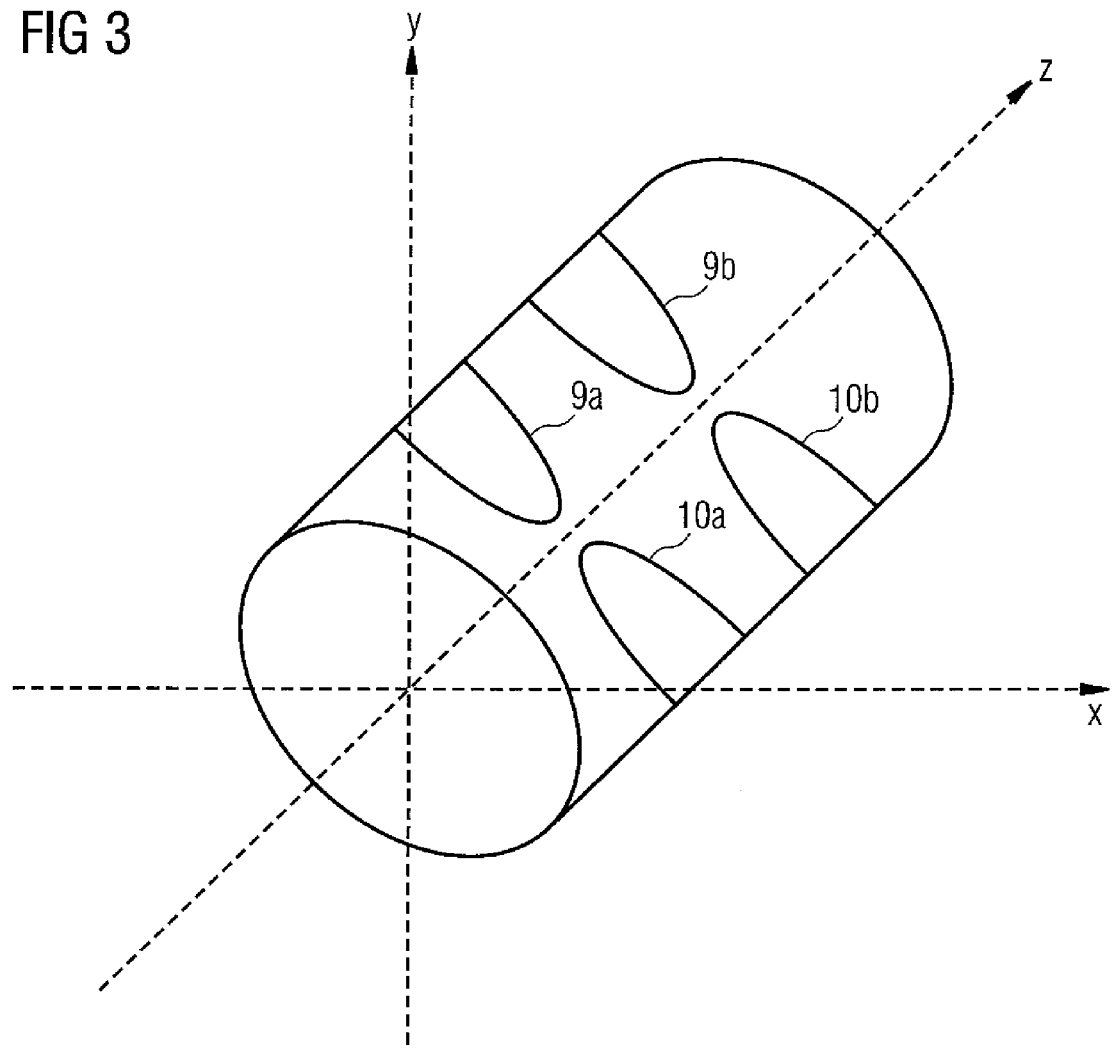
FIG. 3 shows one embodiment of gradient coils for the (horizontal) X axis.
Figure 4:
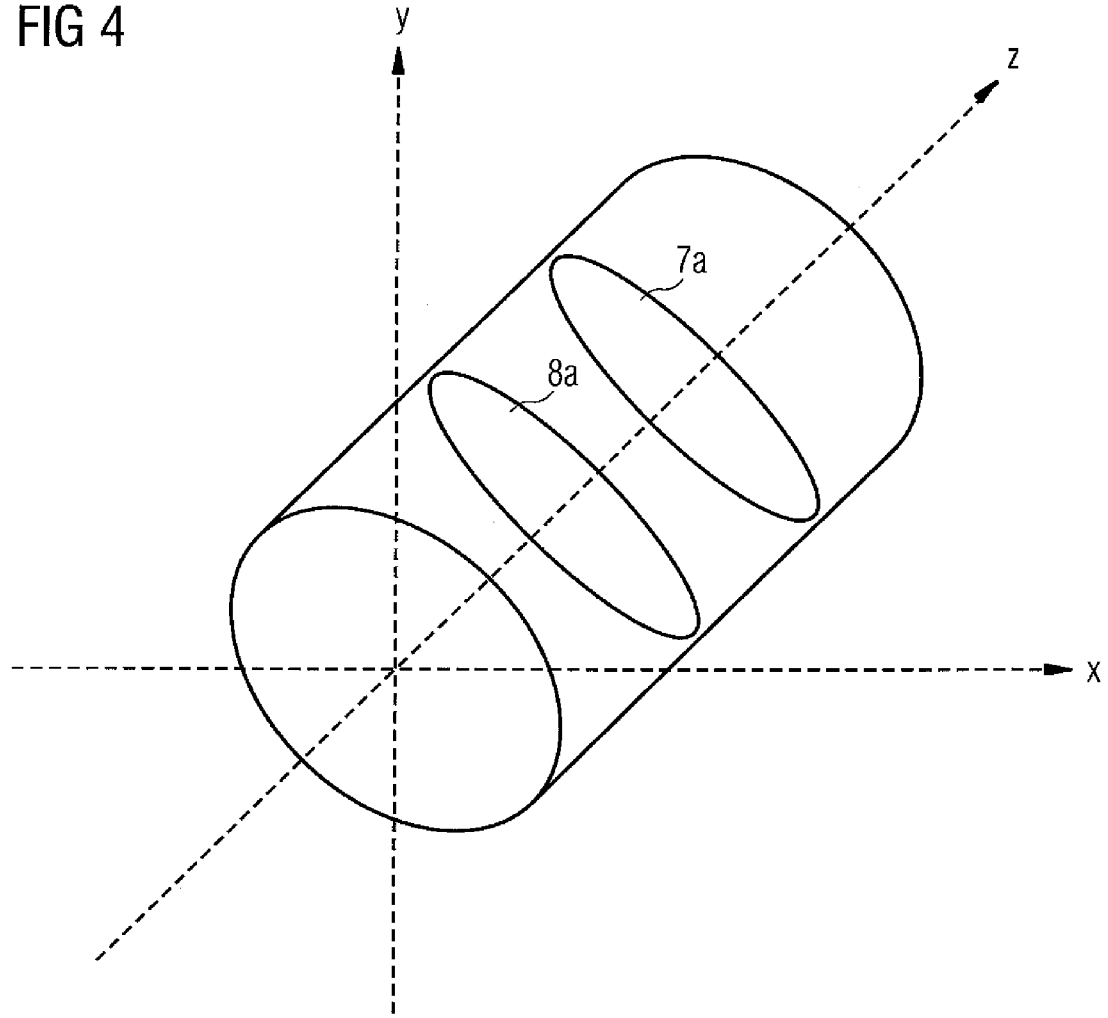
FIG. 4 shows one embodiment of gradient coils for the (vertical) Y axis.

FIG. 3 shows, spatially, gradient coils for the (horizontal) X axis, and FIG. 4 shows, spatially, gradient coils for the (vertical) Y axis.

Figure 5:
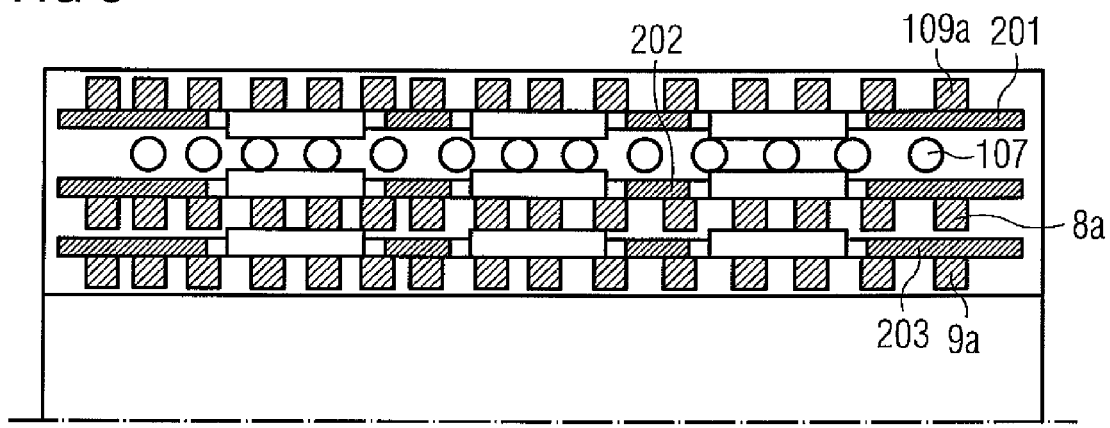
FIG. 5 shows one embodiment of a layer structure of three layers of gradient coils and a cooling layer.

FIG. 5 shows, as a section through the gradient coil arrangement 2, a layer structure of three layers of gradient coils (e.g., the X gradient coil 9a, the Y gradient coil 8a and the Z gradient coil 109a) and the carrier plates 201, 202, 203 between the layers of the gradient coils 8a, 9a, 109a and between a layer of gradient coils and a cooling layer 107. The cooling layer 107 is also illustrated.

Figure 6:
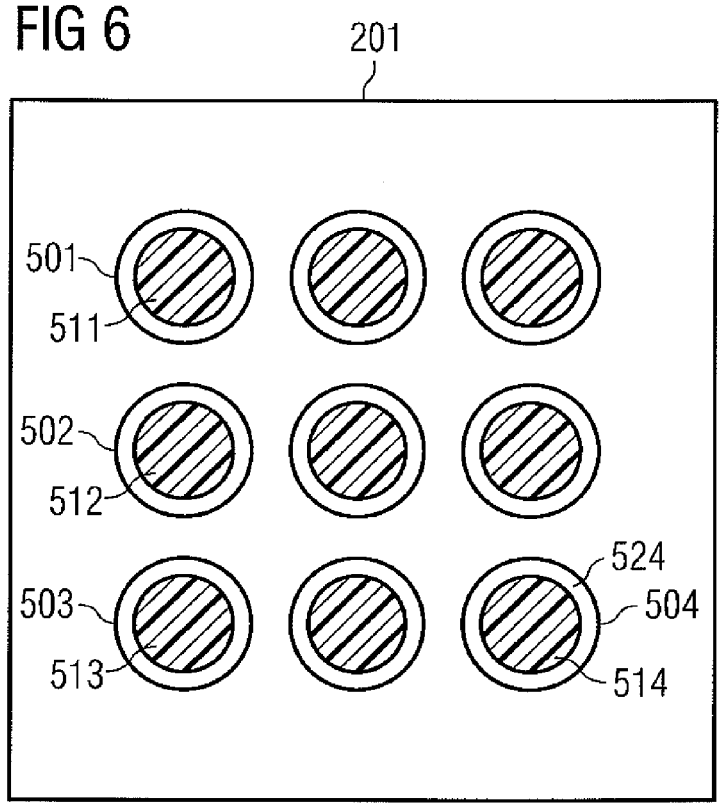
FIG. 6 shows one embodiment of a carrier plate arranged between a gradient coil and a cooling layer.

As shown in FIG. 5 and FIG. 6, holes 501-504 are provided in the carrier plate 201, 202, 203 between, for example, the gradient coil layer 9a or 109a and the cooling layer 107 (e.g., drilled into the carrier plate or produced during casting).

An insert 511, 512, 513, 514 (shown cross-hatched) is located in each of the holes 501, 502, 503, 504. Each of the inserts 511, 512, 513, 514 may have a smaller diameter than the hole 501, 502, 503, 504, in which the inserts are respectively located, so that a hollow space 524 is formed, for example, between the insert 514 and an edge of the hole 504, in which the insert 514 is located. During production of the arrangement shown, in a vacuum casting method, casting resin may have penetrated and may also fill the hollow space 524, for example.

The thickness of the inserts 511-514 is greater than the thickness of the carrier plate 201, 202, 203. The greater thickness of the inserts 511-514 may optimize the abutment of the insert 511, 512, 513 or 514 to the gradient coil layer and to the cooling layer 105, 106, 107, or 108 and thus the heat transfer. The inserts 511, 512, 513 or 514, if they are thicker than the carrier plate 201, 202, 203, may also be elastically or plastically compressible, so that even adjacent carrier plates, gradient coil layers and cooling layers may abut one another.

Figure 7:
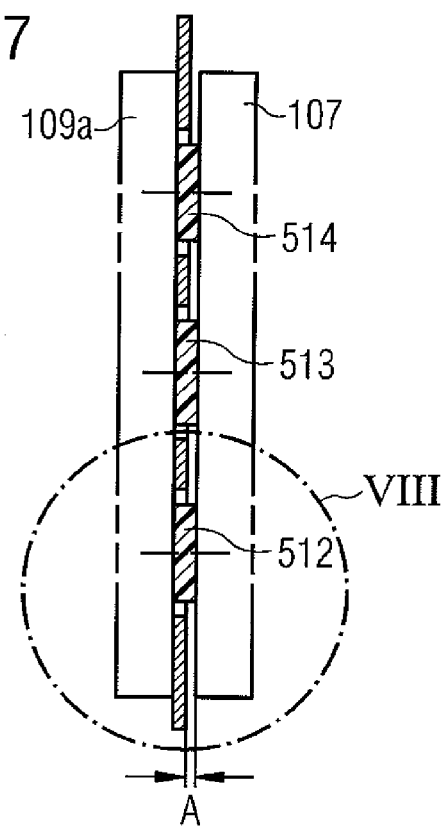
FIG. 7 shows a cross-sectional view of one embodiment of the carrier plate shown in FIG. 6.

FIG. 7 shows one embodiment of the carrier plate from FIG. 6 in a cross-sectional view. As illustrated, the inserts 511-514 (e.g., "pads") may act as spacers between the gradient coil layers or between a gradient coil layer and a cooling layer.

Figure 8:
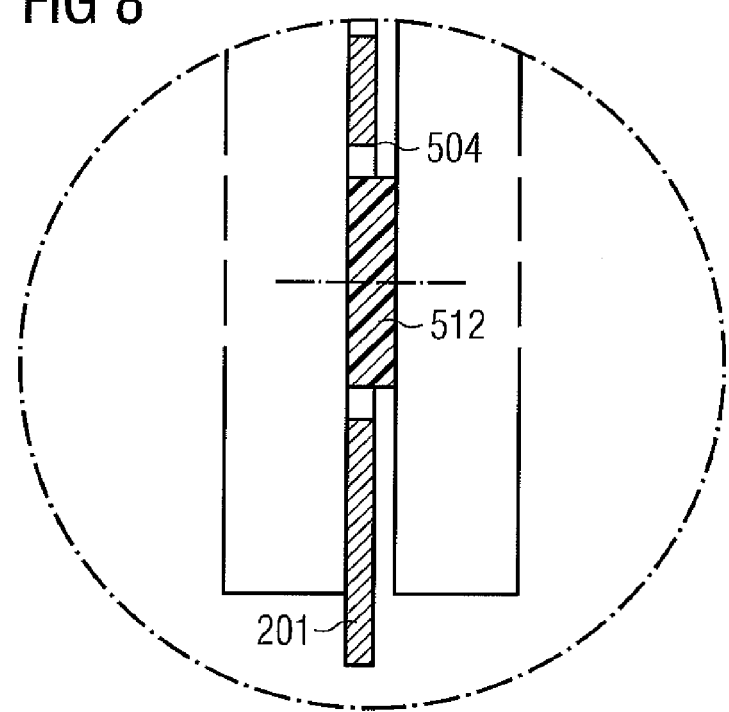
FIG. 8 shows a detail VIII from FIG. 7.

FIG. 8 shows an enlarged detail VIII from FIG. 7 of the insert 504 in the hole 514 in the carrier plate 201 between a Z gradient coil and a cooling layer (e.g., with cooling tubes for water or other coolants).

A perforation of the carrier plate 201 in the region of the largest conductor density of a saddle coil with holes approx. 4 cm in size has a somewhat minor effect on the mechanical strength. Thus, the thermal resistance between a cooling plane 109 and a gradient axis arrangement 109a adjacent to a cooling plane 107 is reduced (e.g., 0.25 Watts per meter Kelvin to 0.8 Watts per meter Kelvin). Gaps or hollow spaces in a region of the holes are filled by a casting compound during production of the gradient coil arrangement. Since radially adjacent layers exert pressure on the hollow spaces and may deform the hollow spaces or almost completely compress the hollow spaces, an electric strength toward the cooling plane may not be provided.

In one embodiment, the restriction of the lack of isolation strength is removed, and the thermal resistance toward the cooling plane is significantly reduced. This is achieved by the selective introduction of dimensionally stable thermally conductive inserts of high electric strength (also referred to as "inserts," "cushions," "pads" or "heat-conducting pads" in the following) into holes or perforations 501-504 in GRP carrier plates. A radial thickness of the pads is greater than a thickness of the carrier plate and is selected (e.g., 1.5 mm) such that surfaces of adjacent conductor layers or a cooling layer directly abut a surface of the pad. At an edge of the carrier plate perforation, a gap of 2-3 mm, for example, may remain. In one embodiment, the gap is impregnated with casting compound, which provides a good electric strength.

The perforation (with a pad insert) of the carrier plates, for example, may be advantageously applied in the case of the carrier plate of a gradient axis remote from cooling.

Silicon-filled pads currently commercially available have sufficient electric strength in the range of 6 kV, for example, and thermal conductivities in the range of 2-10 Watts per meter Kelvin, for example. Thus, the thermal flow in a region of the holes produced as plate press cuts may be increased by approximately up to a factor of 12. Because of the high specific thermal conductivity of silicon (e.g., up to 150 Watts per meter Kelvin), further potential for improvement exists when using a material specially developed for this application.

Gap fillers are commercially available. Gap fillers are GRP fabric wound onto rolls with a filling of highly thermally conductive material (e.g., boron nitride).

The pads may either be introduced individually and manually (e.g., in the case of the coil structure) or with the aid of a carrier network. The carrier network carries all pads at the requisite points, is fully impregnated by the casting compound, and may be mounted in a short amount of time.

Advantages of the present embodiments may also be: good heat transfer; high nominal gradient strengths even with thin-wall "70 cm" gradient coils; low costs because a minimal amount of material is used; low costs because of ease of mounting; facility for selective optimization of thermal conductivity (including for hotspot regions); and the possibility of use with different coil geometries (e.g., cylinder, plate, ellipsoid).

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A gradient coil arrangement for a magnetic resonance tomography device, the gradient coil arrangement comprising:
    a carrier plate comprising holes, the carrier plate for carrying a gradient coil; and
    inserts located in the holes, wherein the inserts are pads,
    wherein a casting compound is located in a gap between one of the inserts and an edge of one of the holes, the one insert being located in the one hole,
    wherein the inserts are thermal conductors, and
    wherein the thermal conductors are introduced into the holes with aid of a carrier network, the carrier network carrying the inserts at designated points and being impregnated by the casting compound.

2. The gradient coil arrangement as claimed in claim 1, wherein the carrier plate abuts at least one gradient coil layer.

3. The gradient coil arrangement as claimed in claim 1, wherein the inserts abut at least one gradient coil layer.

4. The gradient coil arrangement as claimed in claim 1, wherein the holes are perforations in the carrier plate.

5. The gradient coil arrangement as claimed in claim 1, wherein a thickness of each insert is greater than a thickness of the carrier plate.

6. The gradient coil arrangement as claimed in claim 1, wherein a thickness of each insert is selected such that surfaces of gradient coil conductor layers and a cooling layer adjacent to the gradient coil conductor layers abut a surface of the inserts.

7. The gradient coil arrangement as claimed in claim 1, wherein there is a gap of 2-3 mm between the one insert and an edge of the one hole.

8. The gradient coil arrangement as claimed in claim 7, wherein a resin, a casting compound, or a resin and casting compound are located in the gap between the one insert and the edge of the one hole.

9. The gradient coil arrangement as claimed in claim 1, wherein the holes in the carrier plate are provided between a gradient coil layer and a cooling layer.

10. The gradient coil arrangement as claimed in claim 1, wherein each insert has an electric strength of one kilovolt to ten kilovolts.

11. The gradient coil arrangement as claimed in claim 1, wherein the inserts have thermal conductivities of 2-10 Watts per meter Kelvin.

12. The gradient coil arrangement as claimed in claim 1, wherein the thermal conductors contain silicon.

13. The gradient coil arrangement as claimed in claim 12, wherein the thermal conductors are gap-fillers.

14. A gradient coil arrangement for a magnetic resonance tomography device, the gradient coil arrangement comprising:
    a carrier plate comprising holes, the carrier plate for carrying a gradient coil; and
    inserts located in the holes, wherein the inserts are thermal conductors, and
    wherein the thermal conductors contain glass reinforced plastic (GRP) fabric wound onto rolls with a filling of thermally conductive material.

15. The gradient coil arrangement as claimed in claim 1, wherein the thermal conductors are introduced into the holes individually when the gradient coil arrangement was structured.

16. The gradient coil arrangement as claimed in claim 1, wherein each hole has a diameter of 1-10 cm.

17. The gradient coil arrangement as claimed in claim 1, wherein the inserts are of high electric strength.

18. The gradient coil arrangement as claimed in claim 1, wherein the inserts have a higher thermal conductivity, a higher electric strength, or a higher thermal conductivity and a higher electric strength than the carrier plate.

19. The gradient coil arrangement as claimed in claim 6, wherein the thickness of each insert is 1-2 mm.

20. The gradient coil arrangement as claimed in claim 10, wherein each insert has an electric strength of six kilovolts.

21. The gradient coil arrangement as claimed in claim 16, wherein each hole has a diameter of 4 cm.

22. The gradient coil arrangement as claimed in claim 1, wherein each insert comprises an electrically isolating material.

* * * * *